US005243272A

United States Patent [19]

Hall et al.

[11] Patent Number: 5,243,272

[45] Date of Patent: Sep. 7, 1993

[54] METHOD OF TESTING CONTROL MATRICES EMPLOYING DISTRIBUTED SOURCE RETURN

[75] Inventors: Henry P. Hall, Concord; Paul R. Pilotte, Arlington, both of Mass.

[73] Assignee: GenRad, Inc., Concord, Mass.

[21] Appl. No.: 882,217

[22] Filed: May 13, 1992

[51] Int. Cl.[5] ............................................ G01R 31/02

[52] U.S. Cl. ................................ 324/158 R; 324/73.1

[58] Field of Search .............. 324/158 R, 158 D, 73.1; 340/718, 784; 371/15.1, 16.1; 437/8

[56] References Cited

U.S. PATENT DOCUMENTS 5,057,775 10/1991 Hall ................................ 324/158 R 5,073,754 12/1991 Henley ................................ 340/784

Primary Examiner—Vinh Nguyen

Attorney, Agent, or Firm—Cesari and McKenna

[57] ABSTRACT

A test method for a switch matrix (10) of a liquid-crystal display employs a signal source (40, 42) to drive a row line (20) of the matrix and employs current sensors (56, 58, and 60) to measure the resultant current flow. Errors are detected by observing departures of the measured currents from expected values. To increase the sensitivity of the current measurement to the capacitance in the location at which the associated column line (14, 16, or 18) intersects the driven row line (20), return connections for the source (40, 42) are made directly to the contact pads (26, 28) of the row lines not currently being driven and column lines not currently being sensed.

4 Claims, 7 Drawing Sheets

METHOD OF TESTING CONTROL MATRICES EMPLOYING DISTRIBUTED SOURCE RETURN

BACKGROUND OF THE INVENTION

The present invention is directed to testing switch matrices for flat-panel displays.

An active-matrix liquid-crystal display (LCD) is a flatpanel device that comprises a screen divided into pixels, each of which contains liquid-crystal material disposed between an individual pixel electrode and an electrode common to all of the pixels. By varying the potential across the liquid-crystal material at different pixels, one can change the polarization of the light that has propagated through the material at those pixels, and by interaction with a polarizing filter, thereby form an image on the screen.

In an active-matrix-type liquid-crystal display, a separate transistor drives each pixel. FIG. 1 depicts in schematic form a portion of a switch matrix employed for this purpose. The display is organized into rows and columns of pixels, and the drive matrix 10 includes an electrode like electrode 12 for each pixel. Upon assembly into a complete display, electrode 12 will be disposed on one side of the liquid-crystal material, and the common electrode, disposed on the other side, will be tied to a fixed common voltage. To control the voltage on pixel electrode 12, an insulated-gate field-effect-transistor Q1 is provided with its source connected to electrode 12 and its drain connected to a common line 14, to which the drains of the transistors that control all of the pixels in the same column are also connected. We will refer to lines such as line 14 as "column lines,""drain lines," or "data lines." Similar column lines 16 and 18 are connected to the drains of the transistors for different pixel columns.

The gate electrode of transistor Q1 is connected to a row line (or "select line" or "gate line") 20, which conducts enabling signals to the gates of the transistors that control all of the pixels in the same row. Row lines 22 and 24 similarly conduct enabling signals to transistors in different rows.

Drive matrices for flat-panel displays are among the most difficult of electronic devices to fabricate. Their fabrication involves depositing well over 100,000 transistors, together with the associated interconnecting conductors, onto glass. The yield from the fabrication process therefore is typically very low. It is therefore important to test the drive matrix before it is assembled into a display.

However, testing the matrix before it is assembled into the completed part presents significant problems because the matrix lends itself neither to functional testing nor to in-circuit testing. In-circuit testing, i.e., probing internal nodes so as to test the functions of the individual internal devices—in this case the individual transistor drives—is difficult; the small sizes of the transistors make it virtually impossible to probe their individual terminals by conventional techniques, while the use of more-exotic devices, such as scanning electron microscopes, to determine internal node voltages can be prohibitively expensive.

Because of the relatively low number of readily accessible terminals, it might initially seem preferable to employ functional testing, in which only the overall result of the complete circuit's operation is verified by stimulating the device from readily accessible contact points and observing the resulting functional behavior. Unfortunately, the matrix's overall function is to vary pixel transparencies, so there is little external behavior to observe before the liqiud-crystal material is applied.

U.S. Pat. No. 5,057,775 to Hall discloses a method for testing such matrices that does not require a demonstration of the overall functional result but that permits the needed probing to be restricted to little more than the readily accessible terminals on the matrix. FIG. 2 depicts one approach described in that patent. It shows a contact pad 26 in which gate line 20 of FIG. 1 terminates, and it shows a similar contact pad 28 in which drain line 14 terminates. In order to prevent damage due to electrostatic fields that can build up during processing and handling, many manufacturers include a guard ring 30, to which the contact pads 26 and 28 are connected by means of conduction paths 32 and 34, respectively, so as to prevent damaging potential differences.

In one embodiment of the Hall invention, probes 36 and 38 introduce a signal generated by a combination of an AC generator 40 and a DC generator 42 between the gate-line contact pad 26 and the guard ring 30. The DC source 42 is operated selectively to apply either a potential that will turn on transistors in the row controlled by line 20 or a potential that will turn them off. It will be convenient below to refer to these sources collectively as a composite source 43. Probes 44 and 46 contact the drain-line contact pad 28 and the guard ring 30 and lead to respective input ports of a differential amplifier 48 connected in a feedback arrangement so as to tend to drive the drain-line contact pad 28 toward ground in the conventional feedback-amplifier manner. The resultant output voltage of that amplifier is then proportional to the current that flows in drain line 14: the amplifier operates as a current detector. A phase-sensitive detector 50 receives the amplifier output as well as the signal from the AC source 40, and it thereby extracts the in-phase and quadrature components of the drain line's AC current that results from the AC voltage applied to the gate line. Analysis and control circuitry 52 then detects defects and presents them on a display 54 in a manner described in more detail in the Hall patent, which we hereby incorporate by reference.

In general, however, the approach of the Hall patent is to determine whether a transmittance—i.e., a transimpedance or a transadmittance—meets certain predetermined criteria. More specifically, the test ordinarily involves a determination of whether the proper transmittance change occurs when the value of the DC source 42's output is switched between that which should turn transistors on and that which should keep them turned off.

This can be understood by referring to FIG. 1, in which current sensor 56 represents the combination of amplifier 48 and phase-sensitive detector 50 of FIG. 2. With transistor Q1 turned off, an AC signal applied to gate line 20 will cause a current to flow in drain line 14 predominantly because of a capacitance $C_{GD}$ between gate and drain lines 20 and 14. That capacitance accordingly provides a transadmittance between the port at which the driving signal is applied and that at which sensor 56 measures current.

If the DC voltage applied to the gate line 20 turns on transistor Q1, however, that transistor connects to drain line 14 a capacitance $C_{ER}$ that exists between the gate line 20 and the pixel electrode 12. The transadmittance between the two ports will thereby increase. This transadmittance change is accordingly an indication that the transistor is operating properly.

As FIG. 1 indicates, the method would typically be performed by using a number of additional current sensors, such as sensors 58 and 60, to measure other transadmittances simultaneously; a single row line such as row line 20 would be driven, and the currents in many (or all) of the column lines that it crosses would be sensed simultaneously.

The foregoing description of the Hall method shows this application to one kind of display arrangement. It happens in some cases that the pixel electrodes such as electrode 12 overlap the adjacent row line, such as row line 24, or are otherwise in such proximity to it, that significant storage capacitance $C_S$ between them results, and pixel voltages are therefore better maintained between raster scans of the display. For such displays, it may be desirable to test the $C_S$ value, too, and in such cases an AC voltage would additionally be applied to the adjacent gate line. The current measured would thus result from two transadmittances. In still other switch-matrix arrangements, the storage capacitance $C_S$ is provided between the pixel electrode and other "row" lines, parallel to the gate lines, that are not used for gate control but instead act only to provide the additional storage capacitance. In some versions of the Hall method, therefore, such so-called $C_S$ bus lines are also driven.

In every case, however, the purpose is the same, namely, to make a measurement of a quantity that is indicative of a composite capacitance, which we will refer to as $C_X$, that is specific to the location at which the driven row line or lines and the sensed column line intersect. By measuring this capacitance and, typically, a similarly location-specific conductance, one can detect any defects that affect these quantities.

While the method described in the Hall patent is quite an effective way of detecting many defects, the effects of some defects on the pixel capacitance $C_X$ to be sensed are relatively small. To use the method to detect that type of defect thus requires that the method be practiced with a certain precision, and this has presented a problem. Specifically, although the transadmittance measured between a given gate-line terminal and a given drain-line terminal would be most responsive to the capacitance $C_X$ of the location at which those lines intersect, there are well over 100,000 locations in the matrix, and their contributions to that transadmittance, however small individually, have heretofore proved quite significant in total. There are therefore a number of commonly encountered defects that were difficult to detect by previous approaches to applying the Hall method.

SUMMARY OF THE INVENTION

We have found that the sensitivity of the Hall method to the capacitance $C_X$ specific to a particular location can be greatly increased—and the variety of detectable defects thereby also increased—by a judicious selection of connections for the drive-signal return. Specifically, if the return for the drive-signal source is connected directly to unused row and/or column lines, the contributions to the measured currents by capacitances at other locations can be greatly reduced. As will be described in more detail below, this appears to result from reducing the effects of current flow in the guard ring.

BRIEF DESCRIPTION OF THE DRAWINGS

These and further features and advantages of the present invention are described below in connection with the accompanying drawings, in which.

DETAILED DESCRIPTION OF ILLUSTRATIVE EMBODIMENTS

Figure 1:
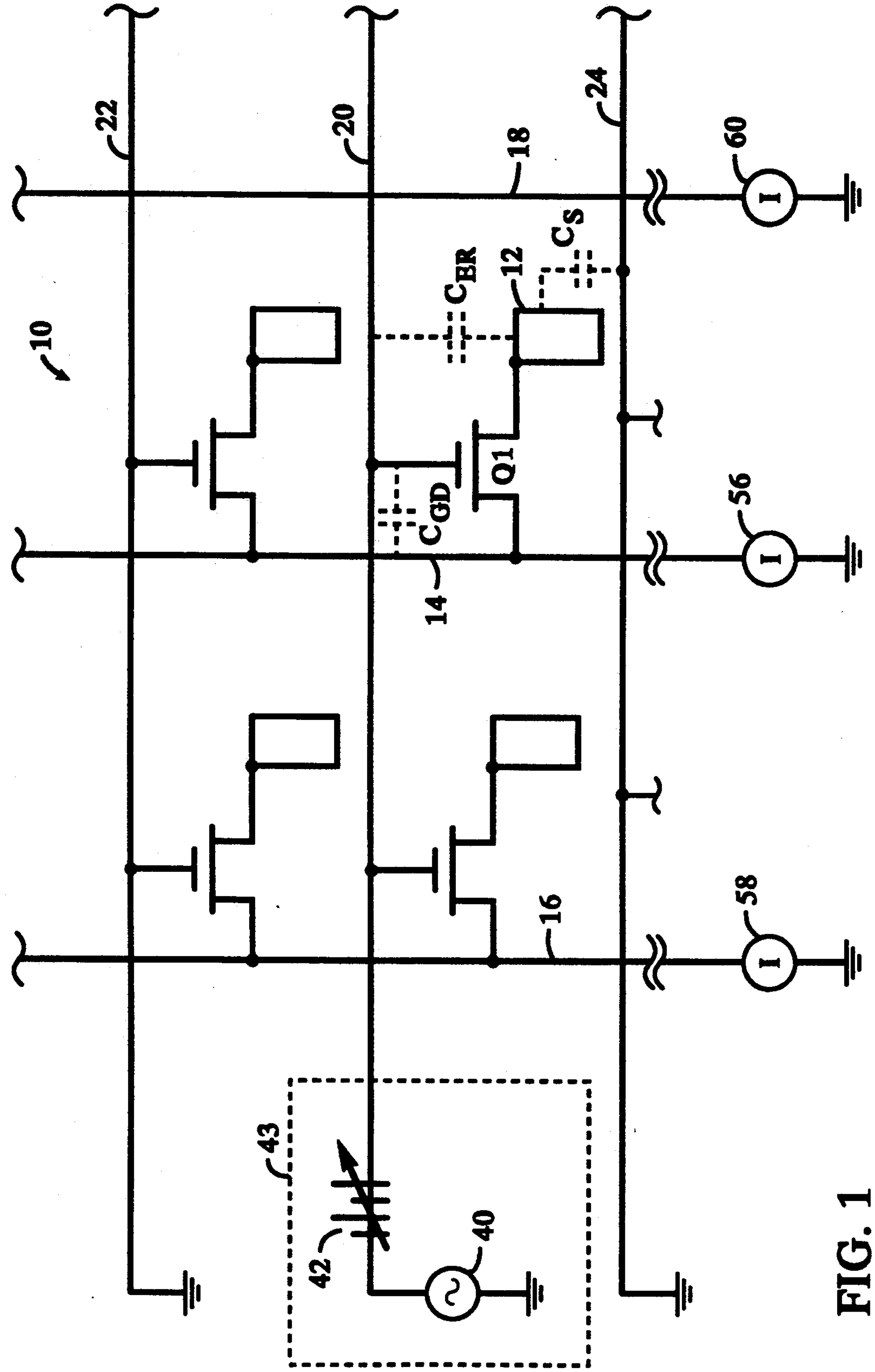
FIG. 1 is a simplified schematic diagram of a switch matrix for a liquid-crystal display, together with some of the instruments for measuring its operability.
Figure 2:
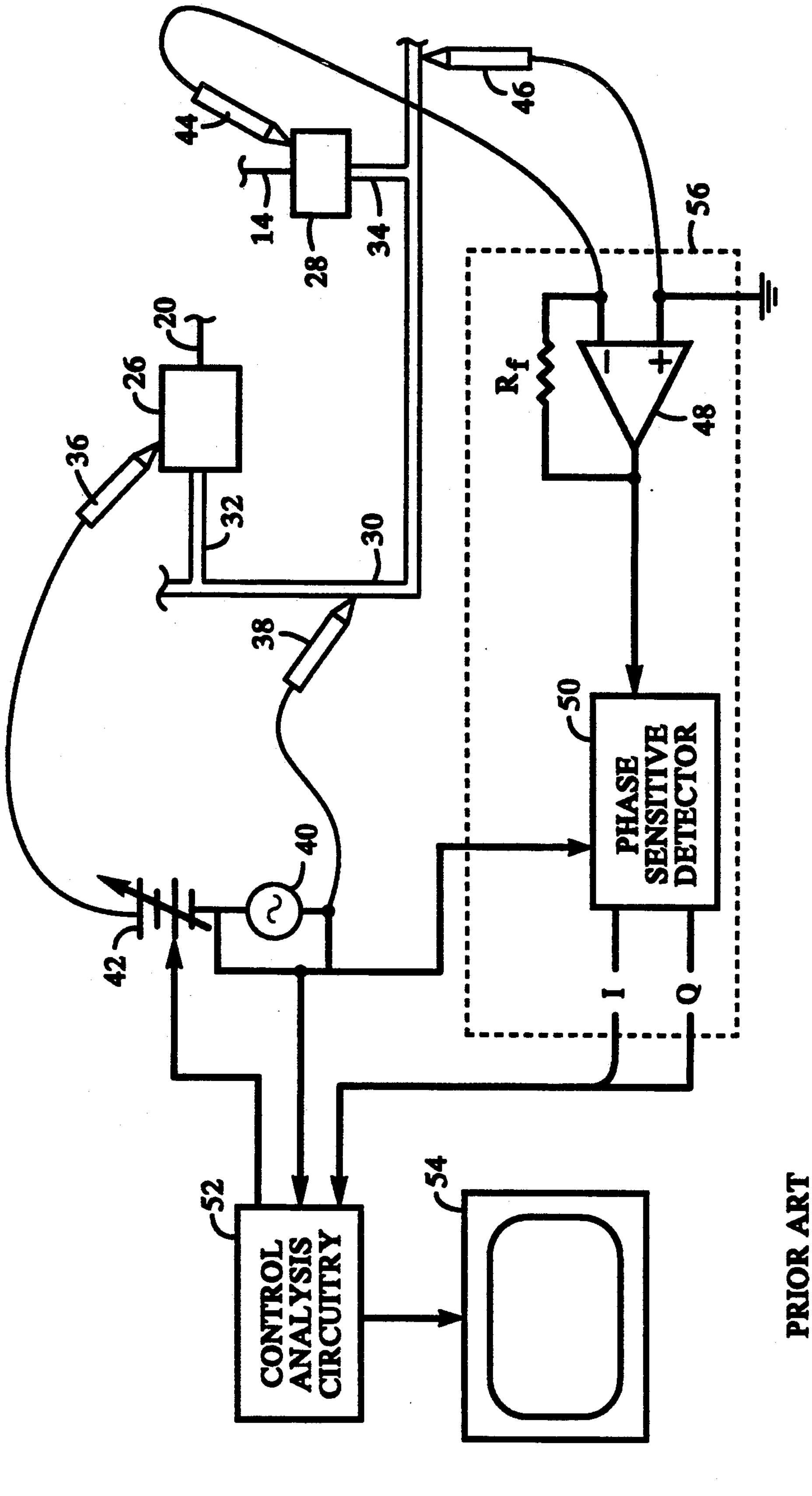
PRIOR ART FIG. 2
FIG. 2 is a block diagram depicting further elements of the test apparatus and their connections to the switch matrix.

Instead of making direct connections of the drive-signal return only to the guard ring 30, as probe 38 of FIG. 2 does, the method of the present invention also makes connections directly to unused gate and/or drain lines. We have found that this produces considerably improved results, and out theory for the reason behind the advance will be described in connection with FIGS. 3–7.

Figure 3:
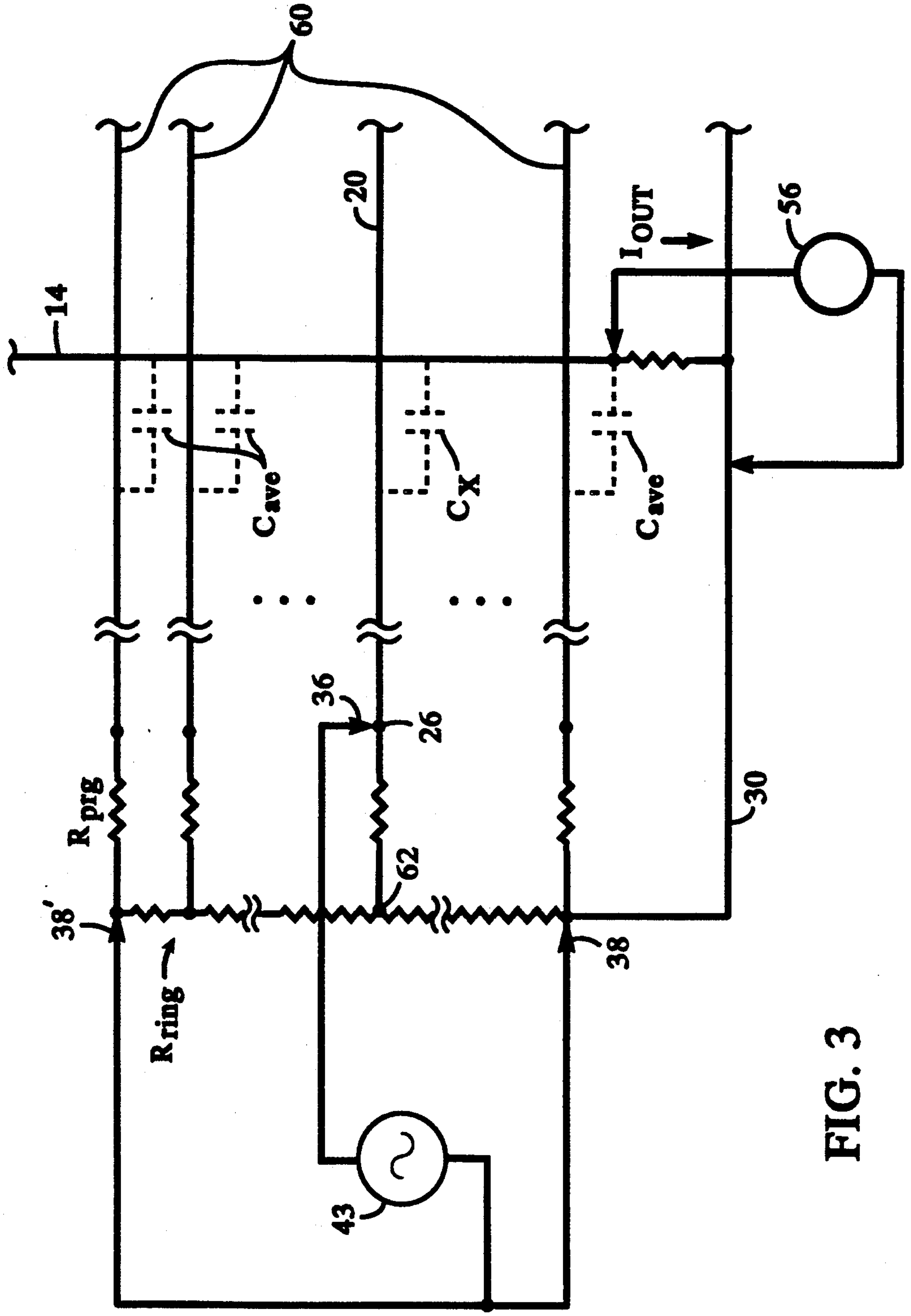
FIG. 3 is a schematic diagram depicting a conventional manner of connecting the source return in a system for practicing the Hall invention.
Figure 4:
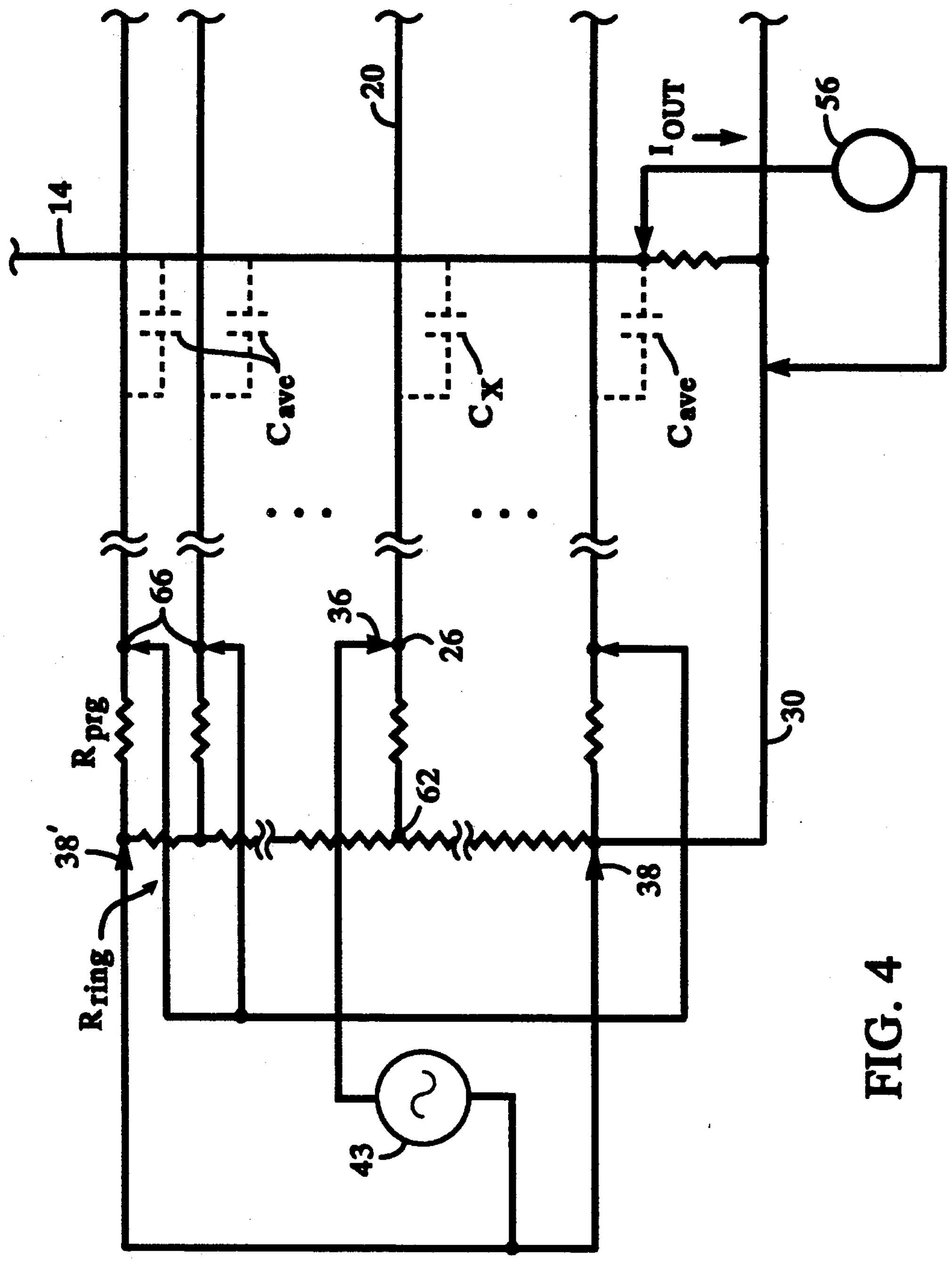
FIG. 4 is a schematic diagram of a distributed-return arrangement employed in accordance with the present invention to practice the Hall method.

The reason for connecting the driver return directly to the unused row lines can be appreciated by considering FIGS. 3 and 4. FIG. 3 depicts the nth drain line 14, the mth gate line 20, and a plurality of other gate lines 60, each of which is connected to the guard ring 30 by a conduction path like path 32 of FIG. 2. By recognizing that the conductance paths have resistances $R_{prg}$ and that the guard ring 32 also presents a resistance $R_{ring}$, we can see that driving the mth gate line 20 in accordance with previous practice introduces signals on the other gate lines, too.

Consider, for instance, the node 62 at which the conduction path from contact pad 26 to the guard ring 30 meets that ring. If the source return is connected to the guard ring, at, say, the ends of the series of gate-line connections, as probes 38 and 38′ indicate, then the voltage signal at node 62 is given by the following equation:

$$E_p = E_{in} \frac{\frac{m}{M}\left(1 - \frac{m}{M}\right)R_{ring}}{R_{prg} + \left(\frac{m}{M}\right)\left(1 - \frac{m}{M}\right)R_{ring}},$$

where m is the number of the active gate line, M is the total number of gate lines, and $R_{ring}$ is the resistance of the part of guard ring 30 between probes 38 and 38′. The average of the voltages on all the inactive gate lines is half this value.

Now, these signals at the other gate lines are coupled to the nth drain line 14 by capacitances between those other gate lines 60 and the drain line 14. If we assume that the impedance of each such capacitance, to which we will assign an average value $C_{ave}$, is high in comparison with the various resistances in the path from the ring-to-gate-line connection to the drain-line contact pad, then the total current $I_{out}$ resulting both from the signal on the driven gate line and from the signals unintentionally applied to the other gate lines is given by:

$$I_{out} = jwC_X E_{in} + \tfrac{1}{2}(M-1)jwC_{ave}E_p.$$

The capacitance that would be measured therefore would not simply be $C_X$, which is intended to be measured. Instead, it would be:

$$C_{measured} = C_x + C_{ave}(M-1)\frac{\frac{m}{M}\left(1-\frac{m}{M}\right)R_{ring}}{2\left[R_{prg} + \left(\frac{m}{M}\right)\left(1-\frac{m}{M}\right)R_{ring}\right]}.$$

This error can be quite large unless $R_{prg}$ is much larger than $(\tfrac{1}{2})(M-1)(R_{ring})$. The above calculation is based on the indicated positions of probes 38 and 38'. The error can be reduced by probing the guard ring at different places, but the resultant error can still be serious. Moreover, the dependence of the error term on m shows that the error varies with position, and this makes it particularly difficult to accommodate.

To solve this problem, we simply probe all of the gate-line pads, as FIG. 4 shows. That is, probes 66 in FIG. 4 connect the source return directly to each of the gate lines that are not being driven, and this largely eliminates the signals on those lines that would otherwise be capacitively coupled from them to the drain line 14.

Figure 5:
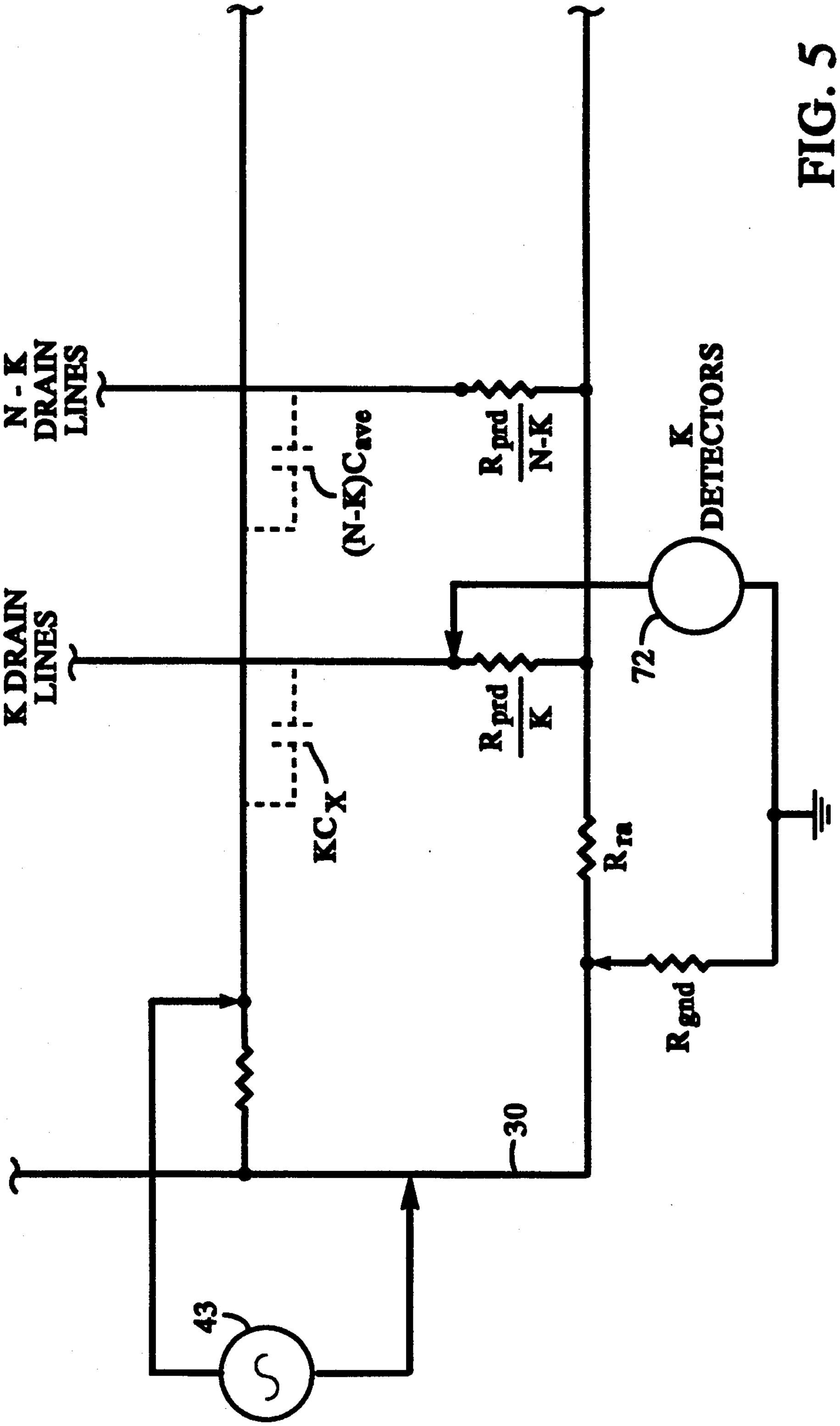
FIG. 5 is a schematic diagram depicting a conventional connection arrangement for use in practicing the Hall method.

It turns out that further error reduction can be similarly obtained by making direct connections not only to the row-line pads but also to the column-line pads. Our analysis of the reason for this can be understood by reference to FIG. 5. In FIG. 5, line 68 represents K drain lines whose currents are intended to be measured simultaneously. Line 70 represents the remaining, "unused" N−K drain lines, where N is the number of columns. Current detector 72 detects the K detectors used to sense current on the K drain lines 68, and the resistance represented by the connections between the drain-line contact pads and the guard ring 30 can be taught of as having a value $R_{prd}/K$, where $R_{prd}$ is the resistance of a single such connection.

For this analysis, we take into account the ring resistance, which is represented in FIG. 5 by the average resistance $R_{ra}$ of that part of the ring between the ground connection and an active drain line. For the sake of simplicity, we ignore other ring resistances.

Under these assumptions, the total current $I_{ta}$ through the active lines is given by $$I_{ta} = KjwC_X E_{in}$$

Similarly, the total current $I_{ti}$ caused by coupling of the signal from the driven gate line 20 to the unused drain lines is given by $$I_{ti} = (N-K)jwC_{ave}E_{in}.$$

This current must return to the source, and the alternate paths to the source are (1) the path that includes the ring-resistance portion $R_{ra}$ and (2) the path that includes the detector, the pad-to-ring resistance $R_{prd}/K$, and a resistance $R_{gnd}$ of the ground connection. If we assume that this ground-connection resistance $R_{gnd}$ and the detector resistance are both small, then we can conclude that the error current $I_{err}$ that flows from the unused drain lines through the K detectors is given by:

$$\begin{aligned} I_{err} &= (N-K)\,jwC_{ave}E_{in}\frac{R_{ra}}{R_{ra} + \frac{R_{prd}}{K}} \\ &= E_{in}\frac{K(N-K)\,jwC_{ave}R_{ra}}{KR_{ra} + R_{prd}}. \end{aligned}$$

In total, then, the current that a single one of the detectors 72 measures is this value divided by K, or:

$$I_{measured} = jw\left[C_x + \frac{(N-K)\,R_{ra}}{KR_{ra} + R_{prd}}C_{ave}\right]E_{in}.$$

The resultant error can be significant. Suppose, for instance, that K=160, N=1920, $R_{prd}$=1000Ω, and $R_{ra}$=1Ω. For these values, the measured capacitance is given by:

$$C_{measured} = C_x + \frac{1760}{(160+1000)}C_{ave} = C_x + 1.52C_{ave}.$$

This is a serious error. Moreover, the error depends on the position of the drain line with respect to the ground connection and is therefore a varying quantity. This complicates the process of setting tolerance limits for fault detection.

Figure 6:
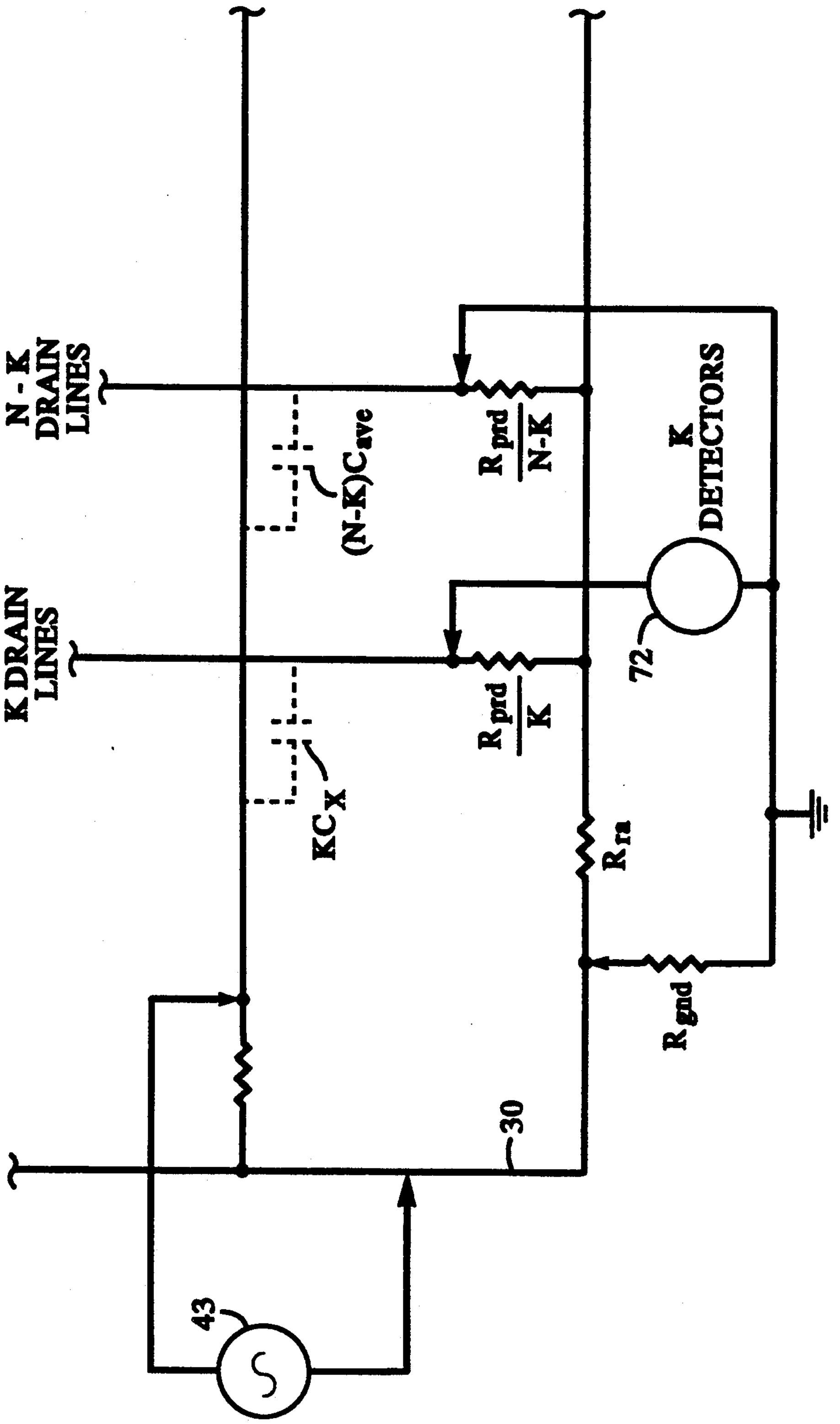
FIG. 6 is a diagram depicting a connection arrangement that one might consider using to eliminate certain of the drawbacks of the arrangement of FIG. 5.

One might propose to eliminate this error by connecting all inactive drain lines to ground, as FIG. 6 illustrates. On the basis of the discussion above, this approach might appear to have a certain appeal. As a practical matter, however, it does not turn out to be consistently workable. The reason is that the ground-connection resistance $R_{gnd}$, which now is no longer in series with the pad-to-ring resistance $R_{prd}/K$, can no longer be neglected in the calculation of error current:

$$I'_{err} = (N-K)\,jwC_{ave}E_{in}\frac{R_{gnd}}{R_{gnd} + R_{ra} + \frac{R_{prd}}{K}}.$$

Therefore, the measured capacitance is not the desired value $C_X$ but instead is given by:

$$C_{measured} = C_x - (N-K)\frac{R_{gnd}}{K(R_{gnd} + R_{ra}) + R_{prd}}C_{ave}.$$

Since the direction of the error current is opposite that of the intended current, this value can actually be negative, making the reactance appear inductive.

The value of $R_{gnd}$ can be several ohms if the probes' contact resistance is poor. In some situations, this could actually make the error worse than that which results from the arrangement of FIG. 5.

Figure 7:
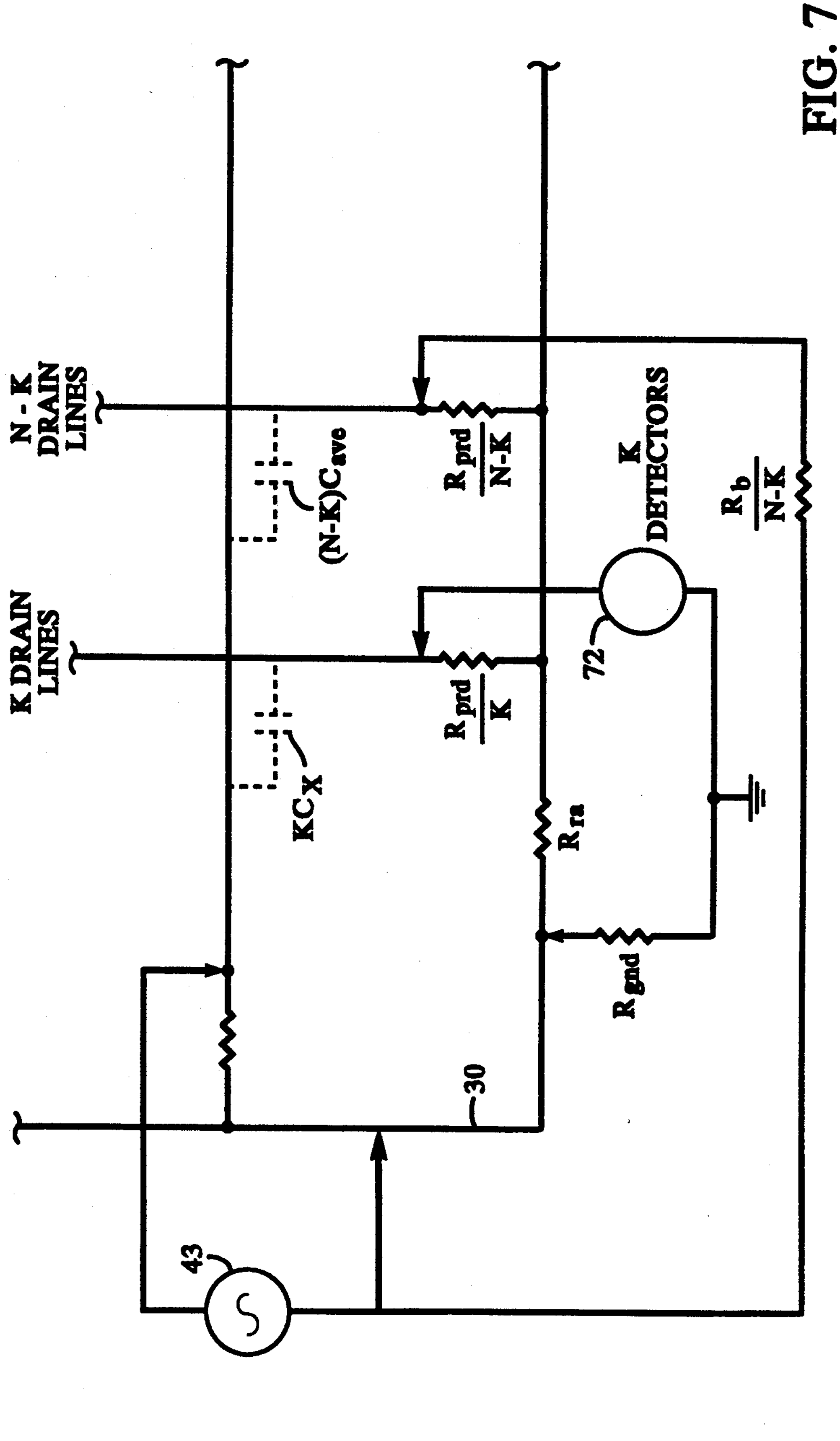
FIG. 7 is a schematic diagram of a connection arrangement employed in accordance with the present invention to carry out the Hall method.

According to the present invention, however, the source return is connected directly to the contact pads of the unused drain lines, as FIG. 7 illustrates. If the average contact resistance per pad is $R_b$ and the resistance of the return path from the probes to the source is negligible in comparison with the value of these contact resistance in parallel, this reduces the error current $I''_{err}$ to a fraction of that which results from the arrangement of FIG. 5;

$$I'_{err} = \frac{\frac{R_b}{N-K}}{\frac{R_b + R_{prd}}{N-K} + \frac{R_{ra}R_{prd}/K}{R_{ra} + R_{prd}/K}} I_{err}$$

in other words, the error current in the arrangement of FIG. 7 bears the same ratio to the error current of FIG. 5 as the parallel resistance of the return probes does to the sum of that value and the value of the resistance of the return path through the pad-to-ring resistances. This fraction is ordinarily quite small, and we believe that this accounts for the greatly increased sensitivity of the Hall method when this connection approach is employed.

Clearly, the best result should be obtained if all of the unused lines are directly connected to the return in the manner described above. However, it may not be practical in all situations to probe all contact pads. Improved results nonetheless can be obtained by probing as many of the unused lines as possible. Thus, the present invention can be employed in many practical situations and thus constitutes a significant advance in the art.

We claim:

1. In the method of testing a flat-panel-display drive matrix before applying liquid-crystal material to it to produce a flat-panel display, the drive matrix being of the type that includes a plurality of transistors arranged in rows and columns, lines including a column line associated with each column and a row line associated with each row, and a guard conductor that interconnects at least some of the lines, each transistor including source and drain terminals, one of which is a terminal adapted to serve as the LCD electrode and the other of which is connected to the column line associated with its transistor's column, each transistor further including a gate terminal connected to the row line associated with that transistor's row, the method including driving at least one line from a signal source that includes a source return, measuring the resultant current that flows in at least one other line, and permitting others of the lines, denominated unused lines, not to be driven or sensed, the improvement comprising connecting the source return directly to at least some of the unused lines.

2. A method as recited in claim 1 wherein:

A) at least some of the unused lines are row lines; and

B) the method further comprises connecting the source return directly to at least some of the unused row lines.

3. A method as recited in claim 2 wherein:

A) at least some of the unused lines are column lines; and

B) the method further comprises connecting the source return directly to at least some of the unused column lines.

4. A method as recited in claim 1 wherein:

A) at least some of the unused lines are column lines; and

B) the method further comprises connecting the source return directly to at least some of the unused column lines.

* * * * *